United States Patent [19]

Kennedy et al.

[11] Patent Number: 4,720,915
[45] Date of Patent: Jan. 26, 1988

[54] PRINTED CIRCUIT BOARD AND PROCESS FOR ITS MANUFACTURE

[75] Inventors: James D. Kennedy, El Cajon; Scott G. McCurdy, Anaheim; Stanley R. Ruggio, La Verne, all of Calif.

[73] Assignee: True Grid, Ltd., Orange, Calif.

[21] Appl. No.: 843,515

[22] Filed: Mar. 25, 1986

[51] Int. Cl.⁴ .............................................. H05K 3/02
[52] U.S. Cl. .................................................... 29/847
[58] Field of Search .................. 29/846, 847; 174/68.5

[56] References Cited

U.S. PATENT DOCUMENTS

| | | | |
|---|---|---|---|
| 3,142,112 | 7/1964 | Burkig et al. | 29/847 |
| 3,226,802 | 1/1966 | Goodwin, Jr. et al. | 29/847 |
| 4,325,780 | 4/1982 | Schulz, Sr. | 174/68.5 |

Primary Examiner—Timothy V. Eley
Attorney, Agent, or Firm—Spensley, Horn, Jubas & Lubitz

[57] ABSTRACT

A method for producing a universal printed circuit board blank and the resulting universal printed circuit board blank are described. An array of pads and traces are printed on the surface of the board. The traces electrically interconnect evey pad to every other pad. Subsequent processing steps remove selected traces so that only certain particular pads remain connected to certain other pads as required by the circuit design, functioning and layout of the electronic components intended for use with the board.

5 Claims, 5 Drawing Figures

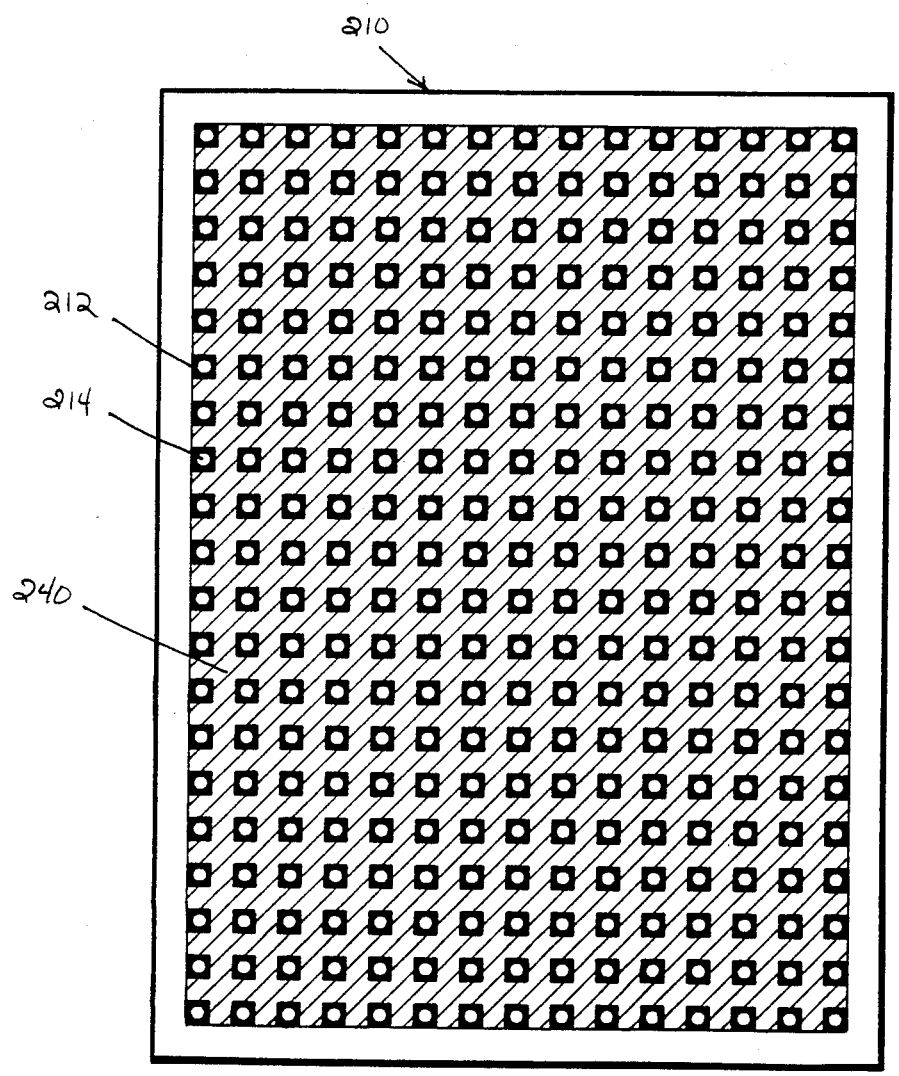

PRINTED CIRCUIT BOARD AND PROCESS FOR ITS MANUFACTURE

BACKGROUND OF THE INVENTION

This invention relates to the field of printed circuit board design and manufacture, and more particularly to a printed circuit board having a universal trace, pad and hole pattern which allows the board to be manufactured virtually to completion before the manufacturer even obtains the masks to create the trace pattern for a particular circuit.

Printed circuit boards are used in a wide variety of electronic devices. The boards serve to support the electronic circuit components of the devices while "printed" filaments of conductive material (called traces) on the surface of the insulating board substrate, supply power to and interconnect the circuit components mounted on the board surface. In multilayer boards, some of the traces run between insulating layers in the interior of the board.

Printed traces perform the same function as wires but have several advantages over wire. For example, since the traces are printed on the board, they are considerably less bulky than wire. Printed traces also eliminate all of the labor that is required to interconnect electronic components with wire, such as cutting the wire to appropriate lengths, stripping insulation off the wire, soldering individual wires to component leads, etc.

In addition to traces, conventional printed circuit boards also have "pads" and "holes." A pad is an area of conductive material which is printed on the board surface and to which a component lead is attached. Each pad is coated with a small quantity of solder. Each pad is also usually centered around a hole which is drilled through the board. The holes receive the component leads and, when melted and then resolidified, the solder on the pads electrically and mechanically connects the leads to the pads. The traces, of course, electrically interconnect the pads to form a working circuit.

A variety of techniques exist for making printed circuit boards. These previously known techniques utilize partially transparent optical masks containing an image of the desired pads and traces. Through a series of production steps this image is transferred to the board and embodied in the form of conductive copper pads and traces on the insulating board substrate. However, since the traces must interconnect the component leads in the proper fashion to form a functioning circuit, these previous techniques require that the circuit to be imaged on the board be completely designed and that the position of the components on the board be determined before the mask can be created. Thus, except for a few of the very earliest steps toward manufacturing the completed board, such as forming an insulating substrate, virtually all manufacturing steps toward the completion of previously known printed circuit boards must wait until the particular circuit and component positions are determined so that a mask having the correct pad and trace image can be created.

In practice, the delay of these manufacturing steps frequently results in a rush to produce prototype boards in order to keep up with production schedules. Furthermore, the small quantity of prototype boards required to test the circuit design, coupled with the premium rates for fast service can increase the cost of conventional prototype boards by factors of ten or more over normal printed circuit board production costs.

Once the design of the device passes the prototype stage, conventional printed circuit boards are then usually manufactured in large quantities in advance of the time required as a way to reduce costs. However, errors in the design of the board, a change in design concept or lack of a previously available component can render existing inventories useless since the conventional boards are specifically designed for only one particular circuit and layout of electronic components.

Although a number of different methods for producing conventional printed circuit boards are now in use, two methods predominate. The first method, which is called the "print and etch" method, proceeds generally as follows:

The first step is to make a printed circuit board blank by covering a board made of insulating material with thin copper foil. The insulating board is generally, but not necessarily, made of a laminated epoxy and fiberglass composition which is frequently referred to in the printed circuit board industry as "laminate." With many previously known printed circuit board production techniques, producing the laminate blanks was the only step in the production process which a manufacturer could perform before obtaining the printed circuit masks.

After the manufacturer obtains these "artwork" masks having the unique pad and trace image for a particular circuit and component layout, he can then drill holes in the blank at the center of each pad location. However, friction caused by drilling melts the epoxy resin of the laminate around the hole. This melted epoxy resin may be removed with an etching solution in a process known in the printed circuit board industry as "smear removal."

For multilayer boards, smear removal is particularly important since it exposes the edges of certain interior conductive traces positioned at the circumference of particular holes. The interior walls of the holes are then plated with copper in an electroless plating process so that the electroless copper plating electrically connects the inner layer traces, which abut the edges of the the holes, to the exterior traces abutting the same holes. In this way, the drilling, smear removal and electroless plating processes electrically connect components without having traces use up space on the surface of the board. This foil coated board is then electroplated with additional copper until a desired thickness of copper is built up on the board and the walls of the holes.

The resulting electroplated board is then coated with photo-resist. A partly transparent optical mask containing a negative image of the pads and circuit traces is placed on the photo-resist coated surface of the board. The walls of the holes and those portions of the board which will form the pads and traces are then exposed to ultraviolet light through the transparent portions of the mask. The ultraviolet light polymerizes the photo-resist. The remainder of the board surface is protected from exposure to the ultraviolet light by the opaque portions of the mask. Unpolymerized photo-resist under these opaque portions is then stripped away by a developing solution capable of removing unpolymerized photo-resist. This solution does not, however, affect the exposed polymerized portions. The resulting circuit board has a positive photo-resist image of the pads and traces printed thereon. This process for creating a photo-resist image of the pads and traces on the circuit board blank is called "imaging."

The imaged circuit board is then placed in an etching bath which etches away the unprotected copper. Since the etching solution in the bath does not attack the polymerized photo-resist, the pads, the plated hole walls and the traces protected by the polymerized photo-resist remain on the board. The resulting board is then immersed in a solution which chemically strips away the polymerized photo-resist, leaving bare copper traces, pads, and plated holes.

The next step is to cover all of the traces with a coating of "solder-mask." In the solder-masking process, virtually the entire surface of the board is coated with solder-mask material, including the exposed portions of the insulating board substrate as well as the traces. Only the pads and the walls of the holes remain bare.

The board is then dipped in a tank of molten solder. Molten solder, however, will not adhere to the solder-mask. Thus, when the board is removed from the tank, only the pads and holes are coated with solder. To prevent the solder from plugging the holes, a blast of hot air is directed against the surface of the board. The air blast blows excess solder out of the holes.

In later production steps, when electronic components are attached to the board, the solder on the pads is remelted and then resolidified around the component leads to electrically and mechanically connect the electronic components to the printed circuit board. Additional solder may be supplied to the pads and leads during this step and the coating of solder-mask over the traces prevents this additional solder from shorting out adjacent traces.

Since the solder-mask protects the traces during the soldering process, it must be both insulating and, unlike photo-resist, it must also be resistant to the high temperature of molten solder. Several different kinds of solder-mask exist. A commonly used solder mask, called Vacrel,[1] is polymerized with ultraviolet light and is thus used in the same manner as conventional photo-resist. However, other types of non-photosensitive solder-mask may be silk screened onto the surface of the board so that the solder-mask material coats the entire surface of the board except for the pads.

[1] Vacrel is a registered trademark of DuPont

A second common method for producing conventional printed circuit boards is called the "pattern plate" method. Although the same general steps are used in both the pattern plate and print and etch methods, and although both methods achieve the same end result, the pattern plating process performs some of the steps in a slightly different way and in a different order.

As with the print and etch method, the pattern plate method starts with a copper foil covered insulating board. The manufacturer must then obtain the optical mask having the unique pad and trace image for the particular circuit and component layout. Holes are then drilled through the board at the center of each pad position, the smear removed and the holes plated with electroless copper.

The resulting copper clad board is coated with photo-resist. As with the print and etch method, a partly transparent optical mask is positioned between the photo-resist coated surface and an ultraviolet light source. However, in contradistinction to the negative trace image of the print and etch mask, the mask used with the pattern plate method contains a positive image of the printed circuit board pads and traces. Thus, those portions of the board which will eventually be etched away are exposed through the mask to polymerize the photo-resist coating. The unpolymerized photo-resist, which is protected from exposure by the opaque portions of the mask, covers those portions of the board which are intended to form the pads and traces. The opaque portions of the mask also protect the walls of the holes from exposure to the ultraviolet light. The unexposed photo-resist covering the pads, traces and hole walls is then dissolved away by the same type of developing solution used in the print and etch method. At this step in the process, the coating of polymerized photo-resist remaining on the printed circuit board blank is a negative image of the pads and traces, as opposed to the positive image formed at the analogous step in the print and etch process.

The bare copper pads, traces and the walls of the holes are subsequently electroplated with an additional layer of copper to a desired thickness and then further electroplated with a mixture of tin and lead. Then, the polymerized photo-resist is chemically removed. The unprotected copper is then etched away. The etching solution which etches away the unprotected copper does not attack the tin-lead plating. Thus, the tin-lead plating over the pads, the walls of the holes and traces acts like the polymerized photo-resist in other steps and protects the underlying copper from dissolution.

The resulting board is then immersed in a chemical stripping solution which removes the tin-lead plating mixture from the copper pads, the walls of the holes and traces. Now the solder-masking procedure can take place exactly as it did in the print and etch technique. That is, the entire surface of the board, except for the pads and hole walls, is coated with solder-mask. Then, the board is dipped in molten solder to coat the pads and the walls of the holes with solder. The traces are not coated with solder since solder will not stick to the protective solder-mask coating. As in the print and etch method, a blast of hot air blows excess molten solder out of the holes.

As can be seen from the above description of conventional printed circuit board production techniques, the imaging steps are performed early on in the processes. Thus, before the vast majority of production steps can be performed, the manufacturer must obtain masks defining the layout of the printed circuit board traces and the position of the pads. This results in a long production time from the completion of a circuit design and creation of a printed circuit board mask to the provision of a finished circuit board product.

In contrast, the printed circuit board and method of printed circuit board manufacture of the present invention allows the printed circuit board manufacturer to perform virtually all manufacturing steps toward production of a completed board before completion of the printed circuit board masks. In fact, the boards of the present invention can be manufactured virtually to completion even before a circuit designer conceives of the particular circuit to be placed on the board.

Furthermore, since, with the present invention, it is not necessary to create large inventories of boards printed for a particular circuit, electronic device manufacturers can modify circuits at any time after the device is in production without sacrificing large inventories of boards. Thus, the present invention eliminates many of the drawbacks of prior known technology with respect to the time interval from when the manufacturer receives the mask to completion of prototype boards and the lack of flexibility in modifying printed circuit board inventories once the traces, pads and holes have been formed on conventional boards.

SUMMARY OF THE INVENTION

Like conventional printed circuit board production techniques, the present inventive process can be divided into two stages. The first stage of production may occur before the printed circuit board manufacturer obtains the masks for imaging a particular trace pattern onto the board. The second stage of production can occur only after the manufacturer obtains the masks. However, unlike conventional production techniques, the first stage of production of the present invention includes substantially all of the printed circuit board production steps. By the end of the first stage, only a few additional steps remain to produce a fully functional board. In contrast, virtually all of the steps of conventional printed circuit board manufacturing methods can only be performed after a mask has been made.

The first stage of the present invention results in a "universal" board. As used herein, the term "universal" describes a printed circuit board having a standardized array of pads on its surface and a grid-like pattern of conductive traces, also on the board surface, which electrically connect every pad to every other pad. This array of pads and interconnecting traces may be formed, for example, by either one of the previously described photographic masking and etching process. If holes are required, holes are drilled through the board so that each hole is in the middle of or adjacent to a pad.

When the present invention is used with multilayer boards, the inner layer traces can be used to distribute power and ground potential to the various electronic components mounted on the board. However, when the inner layer traces are created, it may not be known where on the board power and ground connections will be required. Therefore, the present invention will usually include an inner layer of traces to distribute electrical power to a plurality of predetermined locations on the board and another inner layer of traces to provide ground connections at certain other predetermined locations. These inner layers are electrically connected to the surface traces by the previously described drilling, smear removal and electroless copper plating processes. The electroless copper plated holes which are used to bring power and ground potential to the surface of the board should, in general, be distributed evenly over the board. This will minimize the length and hence the resistance of the surface traces used to connect these holes to the pads that will eventually be soldered to power and ground leads of the various electronic components.

Each pad may be coated with solder. If the print and etch method has been used to form the universal board, then the solder coating may be formed on each pad by first coating the board with photo-resist. Then, using a mask, all areas of the board are exposed to ultraviolet light except the pads and the walls of the holes. The unexposed photo-resist is removed from the pads and hole walls with a developing solution and the pads and hole walls are then plated with a tin-lead mixture. Since the tin-lead mixture will not plate over the photo-resist, only the pads and the hole walls are plated. The polymerized photo-resist protecting the remainder of the board is then removed and the tin-lead mixture is melted so that the tin and lead melt together to form solder.

If, however, the pattern plate method is used to create the universal board, then the solder coating on the pads and hole walls can be formed in a somewhat different manner. As previously explained, a tin-lead mixture is used as an etch-resist in the pattern plate method to protect the copper plating on the hole walls and the copper which forms the pads and traces. In this case, the board is recoated with photo-resist and, using another mask, only the tin-lead plated hole walls and pads are exposed to ultraviolet light. The unexposed photo-resist is then removed to lay bare the tin-lead mixture which covers the copper traces. In this condition, the printed circuit board is placed in a chemical stripping solution which removes the tin-lead plating on the copper traces. The tin-lead plating over the pads and hole walls is protected from the stripping solution by the polymerized photo-resist. After removal of the polymerized photo-resist covering the pads and the walls of the holes, the tin-lead plating is melted to produce a solder alloy.

Since every pad of the universal board is short circuited by the traces to every other pad, the universal board cannot, at this stage in processing, function like a conventional printed circuit board to interconnect only certain particular leads of various electronic components and thereby create a functional circuit. However, like conventional boards, the universal board which is produced at the end of stage one may be covered with a protective anti-oxidation coating to protect the pads and traces and then stored indefinitely.

The ability to produce and store universal boards has many advantages. For example, it reduces the time from production of the printed circuit board masks to production of the completed unique printed circuit board which can form a part of a functional circuit. Once the printed circuit board manufacturer obtains the masks necessary to produce a particular board designed for a particular circuit, only a few simple steps remain in the manufacturing process to convert the inventory of universal boards into boards dedicated to a particular circuit.

Another valuable advantage of the present invention is that it allows the manufacturer to fill in "dead time" in his production schedule when he does not have an order to produce boards dedicated to a particular circuit. During this dead time, the printed circuit board production facility can produce universal boards and then store these boards for use with later orders.

The second stage of the present inventive process occurs after the printed circuit board manufacturer obtains masks for the production of a unique trace pattern. Once masks for a particular circuit are received by the manufacturer, the manufacturer can use his previously manufactured inventory of universal boards and, by conducting a few simple remaining production steps, transform the inventory of universal boards into boards which have a trace pattern usable with a particular circuit and component layout.

The universal boards are transformed into boards dedicated to a particular circuit by covering only the desired traces of the universal board with a protective layer of solder-mask, leaving the unwanted copper traces unprotected. If the solder-mask is of the photosensitive type, the desired traces are protected by coating the entire board with unpolymerized solder-mask and then imaging the board to expose to ultraviolet light only those areas over the desired traces. The unpolymerized solder-mask covering the remainder of the board is then removed. However, if the solder-mask is not the photosensitive type, then the desired traces are covered with solder-mask by using a silk screening process.

The solder-masked board is then etched to remove the unprotected, unwanted copper traces, leaving only the traces which electrically interconnect the pads in the desired configuration. The solder-mask acts like conventional etch-resist and protects the covered traces from the etching solution. The remaining unprotected traces, which would otherwise produce unwanted short circuits between pads, are removed by the etch. The universal board which is produced at the end of stage one will usually have solder coated pads. Thus, it is not necessary to protect the pads from etching in stage two since the solder coating on the pads will not generally be etched away by the etching solution.

At the end of this final stage of the process, the resulting board has traces, which previously formed a grid-like pattern, connecting only certain pads to certain other pads. All of the grid-like traces which would have produced undesired circuit connections will have been etched away. Furthermore, the remaining desired traces are protected from future short circuiting during subsequent soldering processes by the solder-mask.

From the above description of the solder-mask and etching steps, it can be seen that the solder-mask performs two functions. First, it acts like conventional etch-resist to protect the desired traces from etching. Then, after the printed circuit board is completed, it protects the remaining traces from short circuiting during subsequent soldering procedures wherein the leads of various electronic components are soldered to the board.

With this invention, after the printed circuit board manufacturer receives the masks defining a unique trace pattern for a particular circuit, the manufacturer usually need only perform the steps of solder-masking and then etching the universal board. Relative to conventional methods, this essentially two step process greatly reduces the time between receipt of the masks and production of a usable printed circuit board. By comparison, manufacturers of printed circuit boards using conventional production techniques must perform many more production steps after obtaining the masks.

At this point, another great advantage of the present invention will be apparent. Since the universal boards are not dedicated to a particular circuit and associated component layout until the second stage of the production process, it becomes unnecessary to build an inventory of circuit boards having a pad and trace pattern suitable only for use with a particular circuit and component layout. Instead, a manufacturer can build up an inventory of universal boards. The universal board inventory can then be quickly converted into boards dedicated to a particular circuit after receipt of an order.

Furthermore, the future use of inventoried universal boards is far more flexible than conventional boards. If an electronic device using the printed circuit boards of the present invention enters commercial mass production and at some subsequent point in time a design error is discovered or an electronic component previously used on the circuit board becomes unavailable, new printed circuit board masks can be produced embodying changes to compensate for the error or change in availability of components without sacrificing the premanufactured board inventory. In contrast, such design changes could render inventories of conventionally manufactured boards useless.

BRIEF DESCRIPTION OF THE DRAWINGS

FIG. 5 illustrates another embodiment of the board constructed according to the teachings of the present invention. However, unlike the board of FIG. 2, continuous conductive film electrically interconnects every pad to every other pad. The parallel hatch lines of this figure indicate the continuous film and are not individual traces.

DETAILED DESCRIPTION OF THE PREFERRED EMBODIMENTS

Figure 1:
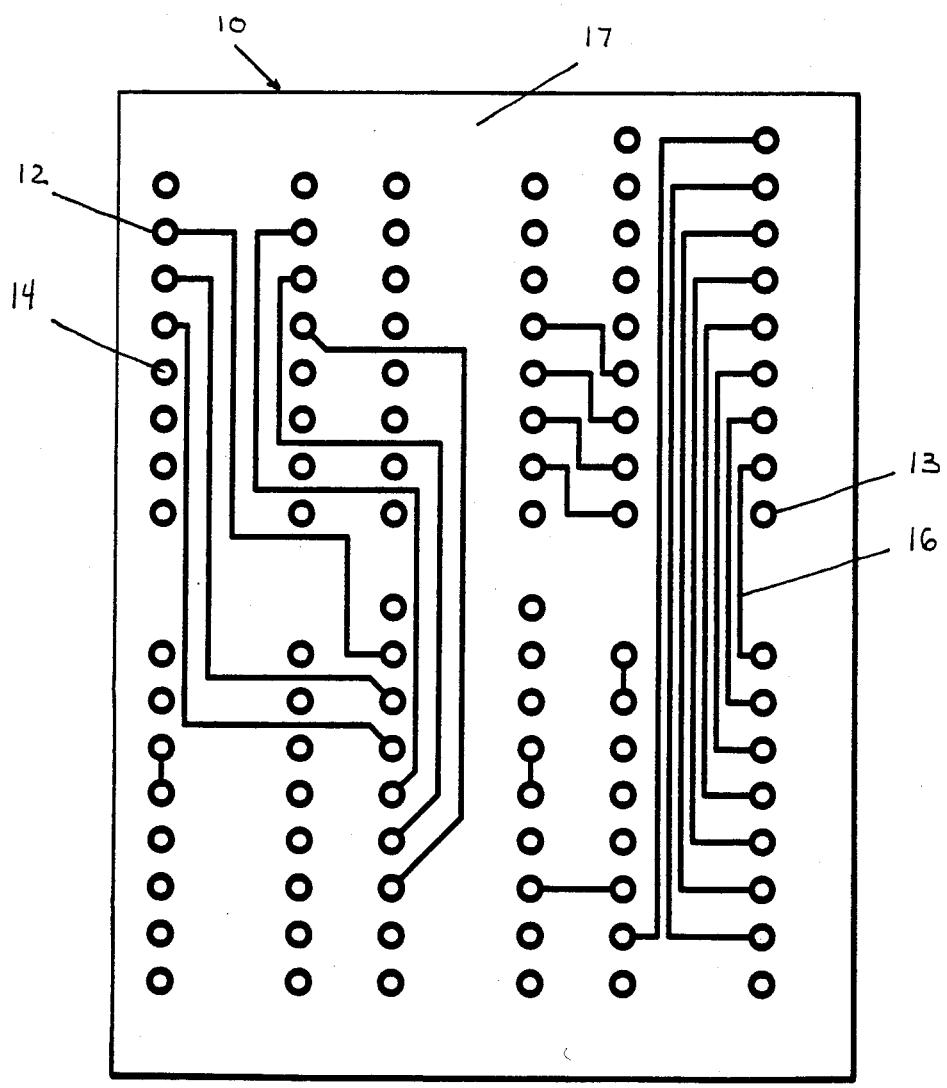
FIG. 1 illustrates one side of a conventional two sided printed circuit board. The traces interconnect only certain pads to certain other pads so that a functioning circuit is formed when the proper components are mounted on and soldered to the board.

FIG. 1 illustrates a printed circuit board 10 constructed according to conventional procedures. This conventional printed circuit board 10 has no more and no fewer pads 12 and holes 14 than are necessary for the proper connection of each component. The pads 12 and traces 16 are printed on an electrically nonconducting substrate 17. Each pad 12 and hole 14 is specifically positioned to align with and connect to a lead of a particular electronic component or to interconnect traces 16 on different layers of the board 10. The traces 16 interconnect leads of one component to leads of other components as required by the functioning of the particular circuit. The pads 12 are positioned around each hole 14 so that when the lead of an electronic component is inserted into the associated hole 14, the solder coating on the surrounding pad 12 can electrically and mechanically connect the lead to the pad 12.

In the conventional printed circuit board 10 of FIG. 1, certain pads, for example pad 13, appear to be electrically isolated from all the other pads 12. However, traces are also printed on the reverse side of the board. These traces appropriately connect the apparently isolated pads 13.

Figure 2:
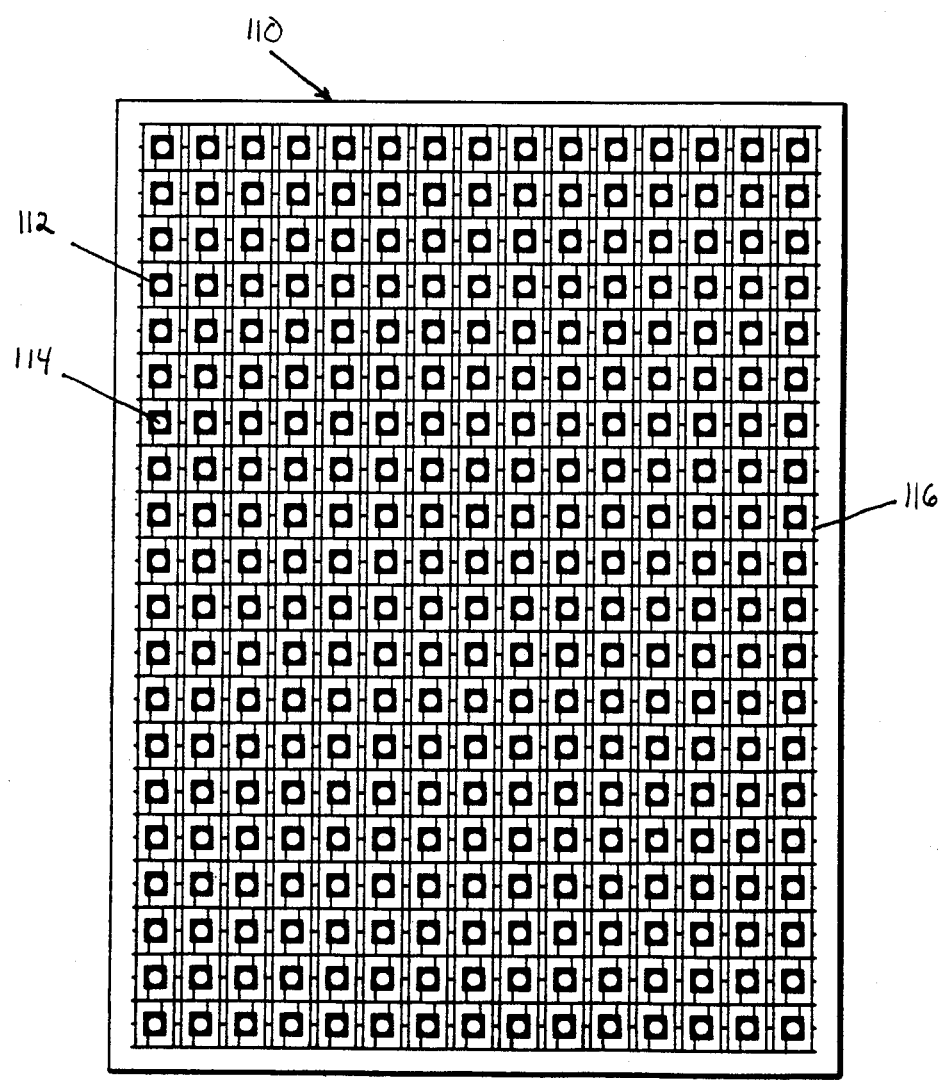
FIG. 2 illustrates an embodiment of the universal board constructed according to the teachings of the present invention. The traces form a grid-like pattern electrically interconnecting every square pad to every other square pad.

FIG. 2 illustrates a "universal" board 110 constructed according to the teachings of the present invention. The universal board 110 of the present invention differs in a number of respects from conventional printed circuit boards. Most obviously, unlike the traces of the conventional board, the electrically conductive traces 116 of the universal board 110 are not designed to interconnect electronic components in any particular manner to result in a functioning circuit. In fact, the universal board 110 cannot function as a part of any circuit since the grid-like pattern of the traces 116 electrically short circuit every pad 112 to every other pad 112.

FIG. 2 also illustrates a second way in which the printed circuit board 110 of the present invention differs from conventional circuit boards 10. As previously explained, each of the holes 14 in a conventional printed circuit board 10 is drilled in a specific location to receive the lead of a specific predetermined component or to interconnect traces 16 on different layers of the board 10. Some copper plated holes 14 may both interconnect traces 16 on different layers of the board 10 and receive a component lead. Thus, as with many of the other steps in conventional processes, the holes 14 cannot be drilled in the board 10 until the placement of the electronic components has been determined.

In contrast to the conventional board 10, which has holes 14 and pads 12 specifically positioned to align with the leads of particular predetermined electronic components, the universal board 110 of the present invention bears a repeating array of pads 112 and holes 114 covering virtually the entire surface of the board 110.

At this point in the production process, the present inventive board 110 of FIG. 2 is not intended for use with any particular circuit design or placement of components. Indeed, the circuit and component layout which will ultimately be used with the present universal board 110 may not, as yet, even have been conceived by a circuit designer. Thus, the pads 112 and holes 114 of the universal board 110 must be positioned sufficiently close together to accommodate the leads of any component that may ultimately be mounted on the board 110.

The universal grid-like trace 116, hole 114 and pad 112 pattern illustrated in FIG. 2 may be produced using many of the same steps used in the production of conventional circuit boards. This universal pattern may be produced, for example, by the print and etch process or the pattern plating process previously described. If a print and etch type process is used, a circuit board blank is first formed having a continuous covering of copper film. The blank may be of either the single, double or multi-layer type. In any case, an array of holes 114 is drilled in the board 110, the smear is etched away and the inside of the holes 114 are plated with copper in an electroless copper plating process.

The copper clad perforated blank may then be electroplated to build up a copper coating on the board to a desired thickness. This blank board is then coated with photo-resist and positively imaged with an array of pads 112, each pad surrounding a hole 114, and a grid-like pattern of traces 116 interconnecting the pads 112 so that every pad 112 is electrically connected to every other pad 112.

The board 110 is then immersed in a developing solution which removes the unpolymerized photo-resist and leaves the polymerized photo-resist on the blank to protect the copper pads 112, the copper plating on the hole walls and the traces 116. The board is then placed in a corrosive bath which etches away the unprotected copper. The desired grid pattern of copper pads 112 and traces 116 is protected from the etching solution in the bath by the polymerized photo-resist.

The next step in the process involves applying a solution to the board 110 which strips away all the polymerized photo-resist. The resulting board 110 is then again coated with photo-resist and, using another mask, all areas of the board are exposed to ultraviolet light except those areas forming the pads 112 and the hole walls. Again, the unexposed photo-resist is removed from the pads 112 and hole walls. These pads 112 and hole walls are then electroplated with a tin-lead mixture. Since the tin-lead mixture will not plate over the photo-resist, the tin-lead mixture plates only on the bare copper pads and the copper which coats the hole walls. The photo-resist which protects the remainder of the board is then removed and the tin-lead mixture is melted so that the tin and lead melt together to form a solder alloy. At this step in the process, the printed circuit board appears as illustrated in FIG. 2. Each pad 112 and hole wall is coated with solder and the grid-like pattern of traces 116 electrically interconnects every pad 112 to every other pad 112.

If the printed circuit board is not intended to be converted into a board for use with a particular circuit until a substantial time in the future, the board may be covered with a protective anti-oxidation coating to prevent oxidation of the pads 112 and traces 116 during storage. Since the boards 110 may be stored indefinitely, a board manufacturer may produce the universal boards 110 just described, protect the boards 110 with a protective anti-oxidation coating (not shown), and build up an inventory of these universal boards 110 for later use.

Once the manufacturer obtains a mask or masks for the production of a particular circuit, there are very few production steps remaining to convert the previously described universal boards 110 in the manufacturer's inventory into boards dedicated to a particular circuit.

Figure 3:
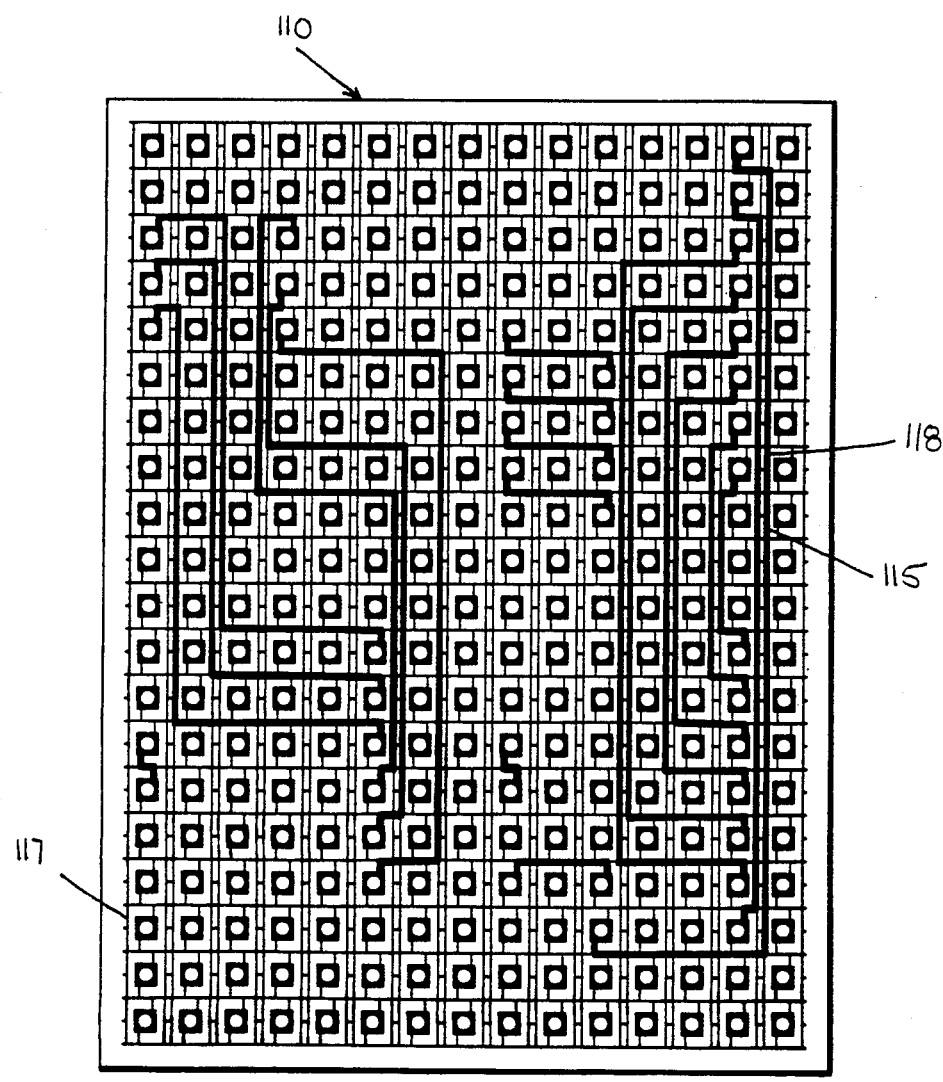
FIG. 3 illustrates the printed circuit board of the present invention after certain wanted traces have been coated with a trace pattern of solder-mask but before the unwanted traces of the grid pattern are etched away.

FIG. 3 illustrates the board 110 which results from the next couple of production steps. As illustrated in FIG. 3, the desired traces 115 which will interconnect the electronic components are protected from subsequent etching with a coating of solder-mask 118. The unwanted traces 117, which would create unwanted circuit connections, are left exposed and unprotected by the solder-mask 118.

To obtain a pattern of solder-mask 118 which covers only the wanted traces 115, the manufacturer can apply a photosensitive solder-mask material, such as Vacrel, to the entire surface of the universal printed circuit board 110 and expose an image of the desired trace pattern through a partly opaque mask. The unexposed solder-mask is then removed from the pads 112 and unwanted traces 117. The resulting board 110 has solder-mask 118 covering only those traces 115 which will later form part of a circuit. The unwanted traces 117 are left unprotected.

Photosensitive solder-mask is generally preferred because of the superior resolution obtainable with photographic masking processes. However, if the superior resolution of photosensitive solder-mask material is not required, then non-photosensitive solder-mask may be applied to the desired traces 115 with a silk screening process. Although the silk screening process has poorer resolution than the optical masking process, the resolution obtainable with silk screening is sufficient for many printed circuit board layouts.

Figure 4:
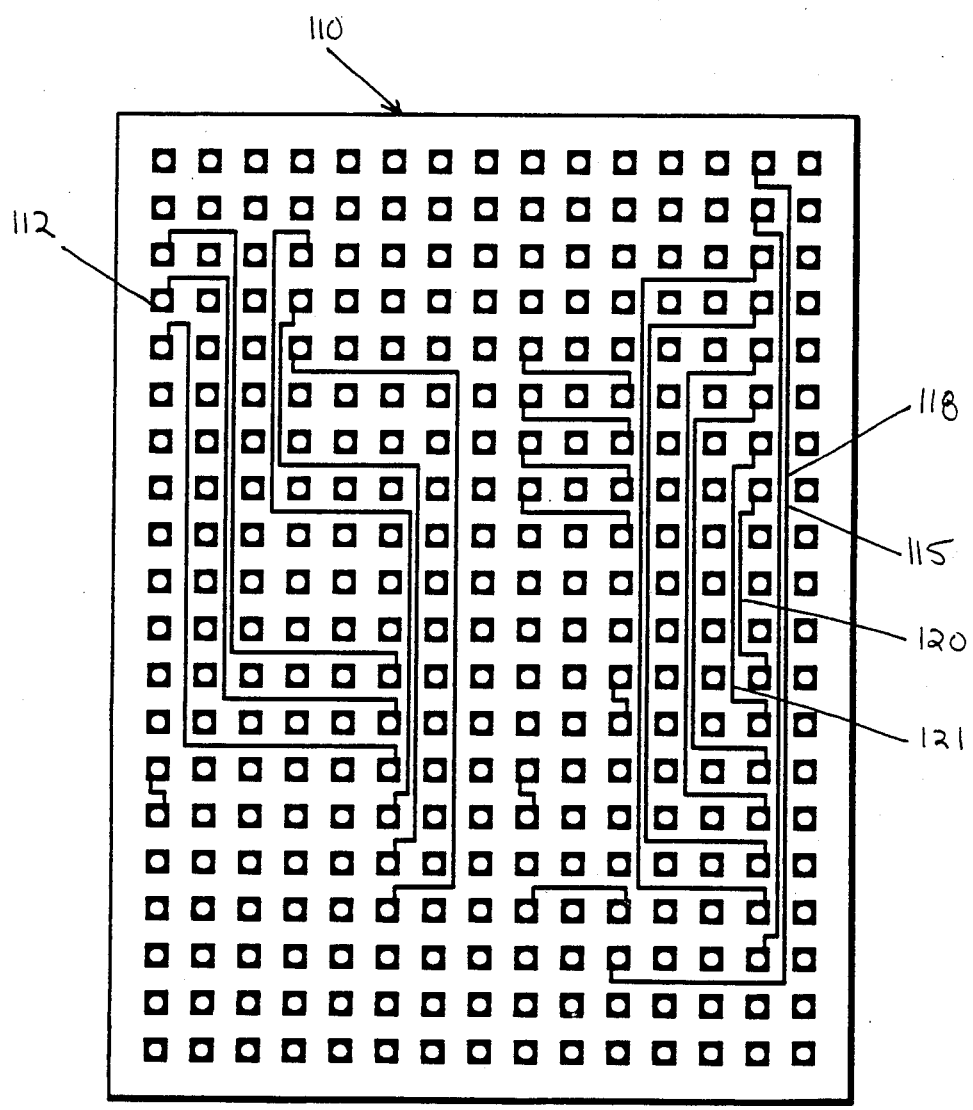
FIG. 4 illustrates the printed circuit board of FIG. 3 after the unwanted grid traces have been etched away and only the desired traces remain. The traces remaining on the board are coated with solder-mask and electrically connect particular pads only to certain other pads to form the desired circuit when the proper components are mounted on the board. The trace pattern of FIG. 4 interconnects the same pads as the conventional trace pattern of FIG. 1.

In the next step, the printed circuit board manufacturer immerses the resulting board 110 in an etching solution which etches away all the unwanted, unprotected copper traces 117 of the grid-like pattern. A typical board 110 produced at the end of this process step is illustrated in FIG. 4. In this figure, all the unwanted traces have been etched away, leaving only the desired traces 115 interconnecting pads 112 in a particular pattern, as required by the particular circuit design and component layout. All of the pads 112 remain on the board 110 surface after the etching step since the pads 112 each have a protective coating of solder. As previously explained, each pad 112 is coated with solder during stage one when the universal board is produced. However, some of the pads 112 will serve no purpose in the completely assembled circuit since they are electrically isolated from all of the other pads 112 after the unwanted traces are etched away.

The traces 115 which remain on the board 110 are protected by the coating of solder-mask 118. The width of the solder-mask lines 118 protecting the wanted traces 115 would, in actuality, be the same both before and after etching. The solder-mask lines 118 appear wider in FIG. 3 than in FIG. 4 for illustrative purposes only. This protective coating of solder-mask 118 serves a dual purpose. In the step previously described, the solder-mask 118 performed the same function as conventional photo-resist by protecting desired copper traces 115 from the etching solution. However, when the electrical components are later soldered to the board 110, the solder-mask 118 will protect adjacent traces, such as traces 120 and 121, from unintentional or accidental short circuiting by stray particles of solder. Conventional photo-resist cannot substitute for solder-mask in stage two of the present invention since photo-resist decomposes before reaching the temperature of molten solder.

In another embodiment of the present invention (FIG. 5), an array of holes 214 is drilled in a circuit board blank having a continuous covering of copper film 240. The continuous copper film is illustrated by the parallel hatch lines of FIG. 5. The hatch lines themselves do not illustrate individual traces interconnecting the various pads 212. After the walls of the holes are plated with copper, the board 210 is then covered with photo-resist. A partly transparent mask is positioned between a source of ultraviolet light and the photo-resist coated surface of the copper clad board 210. The mask contains a positive image of the pads around each hole 214 so that the remainder of the board 210 is exposed to ultraviolet light which polymerizes the photo-resist. The photo-resist covering the pads 212 and the hole walls, however, is protected from exposure to the ultraviolet light by the opaque portions of the mask. The unpolymerized photo-resist on the pads 212 and hole walls is then dissolved away. A tin-lead mixture is subsequently electroplated onto the pads 212 and hole walls. As previously discussed, the tin-lead mixture will not plate over the remainder of the board 210 which is covered with photo-resist.

FIG. 5 illustrates the appearance of the resulting board 210 after all of the photo-resist has been removed and the tin-lead mixture is melted to form solder. A standard array of holes 214 covers the surface of the board 210. Each hole 214 is surrounded by a solder coated pad 212. Every pad 212 is electrically connected to every other pad 212 by the continuous coating of copper film 240.

Like the universal board of FIG. 2, the board 210 of FIG. 5 may also be protected with an anti-oxidation coating and stored indefinitely.

When the printed circuit board manufacturer receives an order for the production of a unique trace pattern for use with a particular circuit and component layout, the manufacturer then creates a solder-mask trace pattern, such as the one shown in FIG. 3, on the surface of the board 210. This trace pattern can be created by any one of the previously described photographic or silk screening methods. The manufacturer then etches away all the copper foil 240 which is not coated either by the protective solder-mask trace pattern or by the solder coating over each pad 212 and hole wall. As in the other previously described preferred embodiment, the resulting board has a regular repeating array of solder coated pads 212 and solder-mask protected traces (not shown).

As can be seen by the foregoing description of the two preferred embodiments of the present invention, relative to conventional printed circuit board manufacturing methods, this invention greatly reduces the number of steps and hence the time from receipt by the manufacturer of the printed circuit board masks containing a unique trace pattern for a particular circuit, to the time when the completed, functional printed circuit board is produced.

Two preferred embodiments of the present invention have been described. However, it is understood that various modifications may be made without departing from the spirit and scope of the invention. For example, in state-of-the-art Surface Mount Technology, electronic components are mounted directly *on* the surface of the printed circuit board so that holes for receiving the leads of the components are not necessary. Therefore, when the present invention is used with surface mounted electronic components, holes to receive component leads would not be drilled through the boards. Thus, the present invention is not limited to the preferred embodiments described herein, but may be altered in a variety of ways which are apparent to persons skilled in the art.

We claim:

1. A process for producing a printed circuit board comprising the steps of:
    (a) covering a nonconductive substrate with a conductive film;
    (b) then removing certain predetermined portions of said conductive film such that the remaining film forms a standarized array of pads and traces electrically interconnecting each pad to every other pad;
    (c) then covering less than all of said traces with a protective material, wherein said protective material is resistant to contact with both molten solder and etching soltuion; and
    (d) then removing with an etching solution only the traces which are not covered by said protective material.

2. A process for producing a printed circuit board, comprising the steps of:
    (a) constructing a printed circuit board blank by applying a conductive film to a surface of a nonconductive substrate;
    (b) forming a standardized array of holes through said blank so that said array of holes covers substantially an entire surface of said blank;
    (c) removing portions of said conductive film from said substrate to leave pads of conductive film adjacent each of said holes and traces of conductive film electrically interconnecting said pads so that each of said pads is electrically connected to every other said pad;
    (d) covering portions of the surface of said printed circuit board blank with a predetermined pattern of solder-mask so that said pattern of solder-mask covers less than all of said traces; and (e) then removing, from the surface of said printed circuit board blank, the conductive traces which are not covered by said solder-mask.

3. The process defined by claim 2, wherein step (e) is performed by applying an etching solution to said traces which are not covered by said solder-mask.

4. A process for producing a printed circuit board for mounting and interconnecting electronic components occupying predetermined areas thereon, said process comprising the steps of:

(a) covering the surface of a nonconductive substrate with a conducting film;

(b) covering the surface of said film with a standardized array of spaced dots of solder material, said dot array occupying a total area of said film which is substantially larger than the predetermined area covered by any one of said electronic components;

(c) covering the surface of said film with a predetermined pattern of solder-mask material, said pattern of solder-mask material interconnecting certain of said dots of solder in a predetermined fashion; and (d) etching the surface of said film to remove portions of the film which were not covered by material in steps (b) and (c).

5. A process for producing a printed circuit board comprising the steps of:

(a) applying a conductive film to one surface of an insulating board;

(b) removing portions of said conductive film from said board in a predetermined pattern so that the conductive film remaining on said board forms;

(i) a standardized array of pads, said array covering substantially the entirety of said one surface of said board, each of said pads having an exposed surface and being spaced from every other said pad; and (ii) traces electrically interconnecting said pads so that each of said pads is connected to every other pad;

(c) covering the exposed surface of said pads with solder;

(d) covering less than all of said traces with a protective, electrically insulating material, said material being resistant to contact with both molten solder and etching solution; and (e) removing with an etching solution only the traces which lack a covering of said protective material.

* * * * *